United States Patent
Booth, Jr. et al.

(10) Patent No.: US 7,863,122 B2
(45) Date of Patent: *Jan. 4, 2011

(54) BULK FINFET DEVICE

(75) Inventors: Roger Allen Booth, Jr., Rochester, MN (US); William Paul Hovis, Rochester, MN (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 223 days.

This patent is subject to a terminal disclaimer.

(21) Appl. No.: 12/133,440

(22) Filed: Jun. 5, 2008

(65) Prior Publication Data

US 2008/0233699 A1 Sep. 25, 2008

Related U.S. Application Data (63) Continuation of application No. 11/427,486, filed on Jun. 29, 2006, now Pat. No. 7,517,764.

(51) Int. Cl.
*H01L 21/336* (2006.01)

(52) U.S. Cl. ................ 438/197; 438/300; 257/E21.442

(58) Field of Classification Search ................ 438/300, 438/197; 257/E21.442
See application file for complete search history.

(56) References Cited

U.S. PATENT DOCUMENTS

| 5,384,710 | A | 1/1995 | Lam et al. |
|---|---|---|---|
| 6,662,350 | B2 | 12/2003 | Fried et al. |
| 6,960,804 | B1 | 11/2005 | Yang et al. |
| 6,989,308 | B2 * | 1/2006 | Furukawa et al. ........... 438/283 |
| 7,095,065 | B2 | 8/2006 | Yu et al. |
| 7,101,763 | B1 | 9/2006 | Anderson et al. |
| 7,105,390 | B2 * | 9/2006 | Brask et al. ................. 438/149 |
| 7,145,220 | B2 | 12/2006 | Morikado |

(Continued)

OTHER PUBLICATIONS

Quirk and Serda, Semiconductor Manufacturing Technology, Prentice Hall, Upper Saddle River, New Jersey, 2001, pp. 289.

(Continued)

*Primary Examiner*—W. David Coleman
*Assistant Examiner*—Sun M Kim
(74) *Attorney, Agent, or Firm*—Schmeiser, Olsen & Watts (57) ABSTRACT

A finFET structure and a method of fabricating the finFET structure. The method includes: forming a silicon fin on a top surface of a silicon substrate; forming a gate dielectric on opposite sidewalls of the fin; forming a gate electrode over a channel region of the fin, the gate electrode in direct physical contact with the gate dielectric layer on the opposite sidewalls of the fin; forming a first source/drain in the fin on a first side of the channel region and forming a second source/drain in the fin on a second side of the channel region; removing a portion of the substrate from under at least a portion of the first and second source/drains to create a void; and filling the void with a dielectric material. The structure includes a body contact between the silicon body of the finFET and the substrate.

11 Claims, 12 Drawing Sheets

U.S. PATENT DOCUMENTS

| | | |
|---|---|---|
| 7,247,896 B2 | 7/2007 | Oh et al. |
| 7,279,375 B2 | 10/2007 | Radosavljevic et al. |
| 7,335,545 B2 | 2/2008 | Currie |
| 7,485,520 B2 * | 2/2009 | Zhu et al. .................. 438/197 |
| 7,667,248 B2 | 2/2010 | Booth et al. |
| 2007/0252198 A1 * | 11/2007 | Chung et al. ................ 438/300 |
| 2007/0267668 A1 | 11/2007 | Fischer |

OTHER PUBLICATIONS

Office Communication (Mail Date Mar. 30, 2010) for U.S. Appl. No. 11/923,121, filed Oct. 24, 2007; Art Unit 2813; Confirmation No. 9043.

* cited by examiner

BULK FINFET DEVICE

This Application is a continuation of U.S. patent application Ser. No. 11/427,486 filed on Jun. 29, 2006.

FIELD OF THE INVENTION

The present invention relates to the field of semiconductor devices; more specifically, it relates to FinFET device structures and methods of fabricating FinFET structures.

BACKGROUND OF THE INVENTION

FinFET (Fin field-effect-transistor) is an emerging technology, which allows smaller and higher performance devices. FinFET structures comprise narrow isolated bars of silicon (fins) with a gate(s) on the sides of the fin. Prior art FinFET structures are formed on silicon-on-insulator (SOI) substrates. However, FinFETs fabricated on SOI substrates suffer from floating body effects. The floating body of a FinFET on an SOI substrate stores charge, which is a function of the history of the device. As such, floating body FinFETs experience threshold voltages which are difficult to anticipate and control, and which vary in time. The body charge storage effects result in dynamic sub-Vt leakage and Vt mismatch among geometrically identical adjacent devices. FinFETs fabricated on bulk silicon substrates do not experience floating body effects, but they do experience greatly increased source/drain to substrate capacitance. Increased source-drain to substrate capacitance is a parasitic effect, which degrades performance (speed).

Therefore, there is a need for FinFET devices and methods of fabricating FinFET devices without floating body effects and with reduced parasitic capacitance.

SUMMARY OF THE INVENTION

A first aspect of the present invention is a structure comprising: a finFET having a silicon body formed on a bulk silicon substrate; a body contact between the silicon body and the substrate; and first and second source/drains formed in the silicon body and insulated from the substrate by a dielectric layer under the fins.

A second aspect of the present invention is a structure, comprising: a single crystal silicon fin extending in a first direction parallel to a top surface of a bulk silicon substrate, the fin having a channel region between first and a second source/drains; an electrically conductive gate electrode extending in a second direction parallel to the top surface of the substrate and crossing over the channel region, the second direction different from the first direction; a gate dielectric between the gate electrode and the fin; at least a portion of the channel region of the fin in direct physical and electrical contact with the substrate; and a dielectric layer between at least a portion of the first source/drain and the substrate and between at least a portion of the second source/drain and the substrate.

A third aspect of the present invention is a method, comprising: forming a silicon fin on a top surface of a silicon substrate; forming a gate dielectric on opposite sidewalls of the fin; forming a gate electrode over a channel region of the fin, the gate electrode in direct physical contact with the gate dielectric layer on the opposite sidewalls of the fin; forming a first source/drain in the fin on a first side of the channel region and forming a second source/drain in the fin on a second side of the channel region; removing a portion of the substrate from under at least a portion of the first and second source/drains to create a void; and filling the void with a dielectric material.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
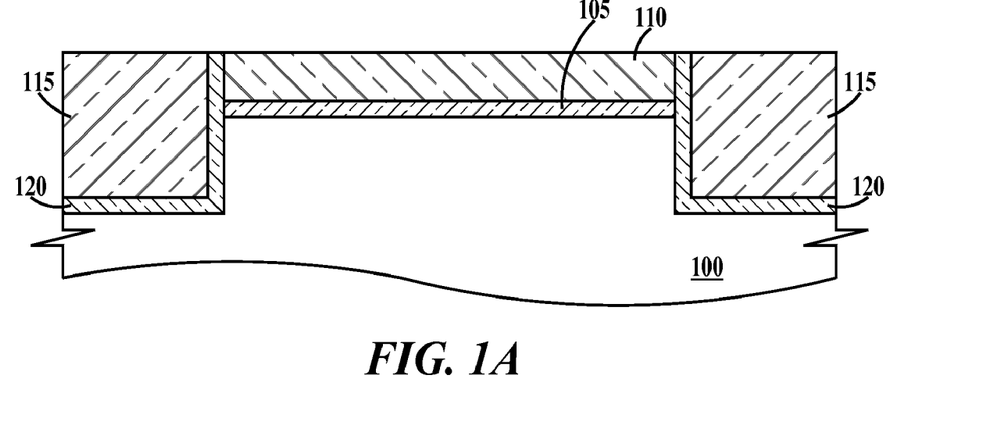
FIGS. 1A through 1F are cross-sectional views illustrating initial steps in the fabrication of FinFETs according to embodiments of the present invention.

FIGS. 1A through 1F are cross-sectional views illustrating initial steps in the fabrication of FinFETs according to embodiments of the present invention. In FIG. 1A, formed on a bulk silicon substrate 100 is a pad silicon oxide layer 105 and formed on the pad oxide layer is a pad silicon nitride layer 110. A bulk silicon substrate is defined as a monolithic block of single-crystal-silicon. Formed through pad silicon oxide layer 105 and pad silicon nitride layer 110 is a dielectric shallow trench isolation (STI) 115. An optional dielectric liner 120 around the sides and bottom surfaces, but not the top surface, of STI 115 is shown. STI 115 may be formed, by photolithographically defining openings in the pad silicon oxide 105 and silicon nitride 110 layers, etching (for example, by reactive ion etch (RIE)) a trench into substrate 100 where the substrate is not protected by the pad layers, backfilling the trenches with dielectric and performing a chemical-mechanical-polish (CMP) so a top surface of the STI is co-planar with a top surface of the pad silicon nitride layer.

In one example, pad oxide layer 105 is formed by thermal oxidation of substrate 100 and between about 5 nm and about 20 nm thick. In one example, pad silicon nitride layer 110 is formed by chemical-vapor-deposition (CVD) and is between about 50 nm and about 500 nm thick. In one example, STI 115 comprises a CVD oxide such as tetraethoxysilane (TEOS) or high-density-plasma (HDP) oxide. In one example, liner 120 comprises less than 50 nm of silicon oxide, silicon nitride or a dual layer of silicon oxide under silicon nitride. In one example, STI 115 is between about 50 nm and about 500 nm thick. Pad silicon nitride layer 110 is then stripped selective to oxide and STI 115 is planarized to be approximately flush with the top surface of pad oxide layer 105.

Figure 1B:
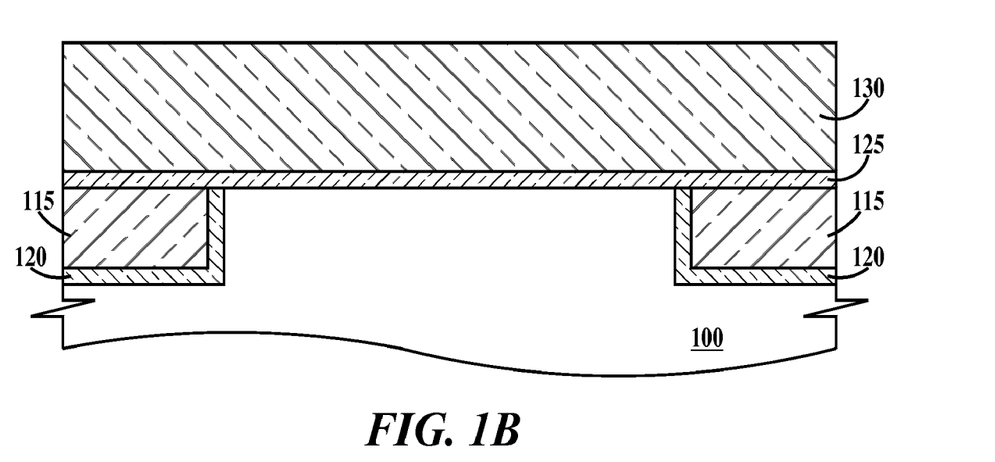

In FIG. 1B, an etch stop layer 125 is deposited over pad silicon oxide 110, STI 115 and exposed edges of liner 120 if present, and a mandrel layer 130 is deposited over the etch stop layer. In one example, etch stop layer comprises CVD silicon nitride and is between about 2 nm and about 10 nm thick. In one example, mandrel layer 130 is CVD oxide described supra, and is between about 100 nm and about 500 nm thick. The thickness of mandrel layer determines the height of the silicon fin (above the current bulk silicon 100/pad silicon oxide layer 125 interface) that will be formed subsequently.

Figure 1C:
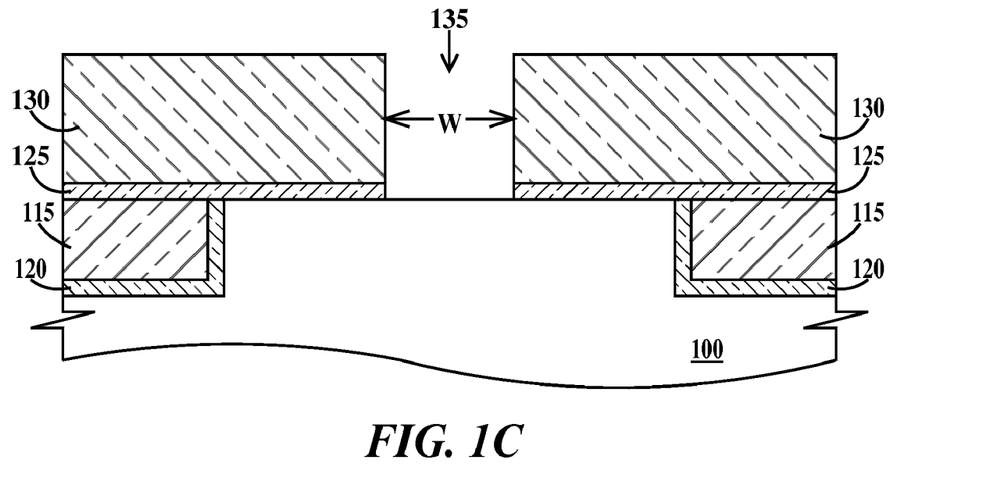

In FIG. 1C, a trench 135 is etched through mandrel layer 130 and etch stop layer 125 to expose substrate 100 in the bottom of the trench. In one example, trench 135 has a width "W" of between about 20 and about 100 nm wide. The width "W" defines the width of the silicon fin (less any subsequent sidewall oxidations, if any) to be subsequently formed.

Figure 1D:
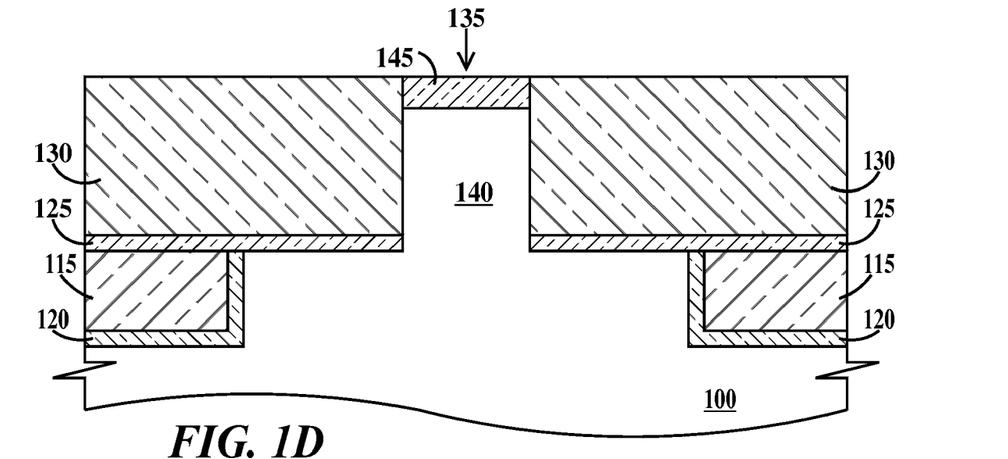

In FIG. 1D, a single-crystal silicon fin 140 covered by a cap 145 is formed in trench 135. Fin 140 may be formed by selective epitaxial growth to above the top surface of mandrel layer 130 followed by planarization and a recess RIE. In one example, the top of fin 140 is recessed between about 20 nm and about 100 nm below the top surface of mandrel layer 130. In one example, cap 145 may be formed by CVD deposition of silicon nitride of sufficient thickness top overfill the recess followed by a CMP so a top surface of cap 145 is coplanar with a top surface of mandrel 130. Alternatively, a polysilicon fin may be formed instead of a single-crystal silicon fin.

Figure 1E:
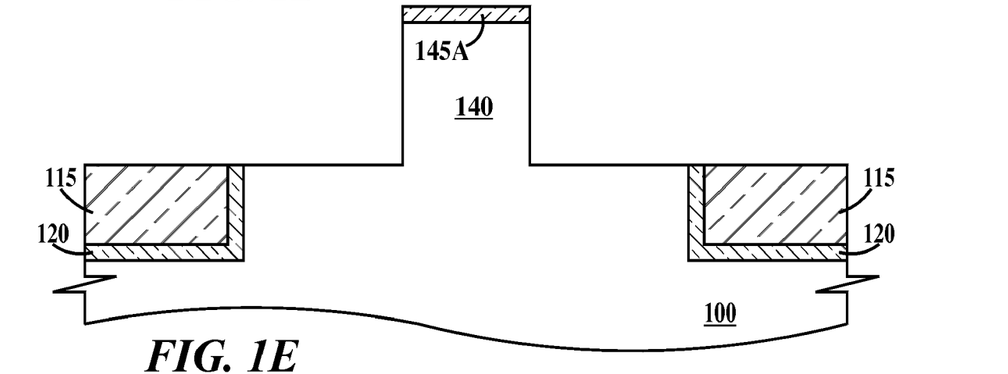

In FIG. 1E, mandrel 130 (see FIG. 1D) is removed. In one example, when mandrel layer 130 is oxide and cap 145 and etch stop layer 125 are silicon nitride, the mandrel is removed with an RIE selective to etch oxide faster than silicon nitride. Alternatively, mandrel layer 130 may be removed by a wet etching process (i.e. aqueous hydrofluoric acid when mandrel 130 is a silicon oxide). Then etch stop layer 125 is removed with a RIE selective to etch silicon nitride faster than silicon oxide, in which case cap 145 (see FIG. 1D) is thinned to form cap 145A.

Figure 1F:
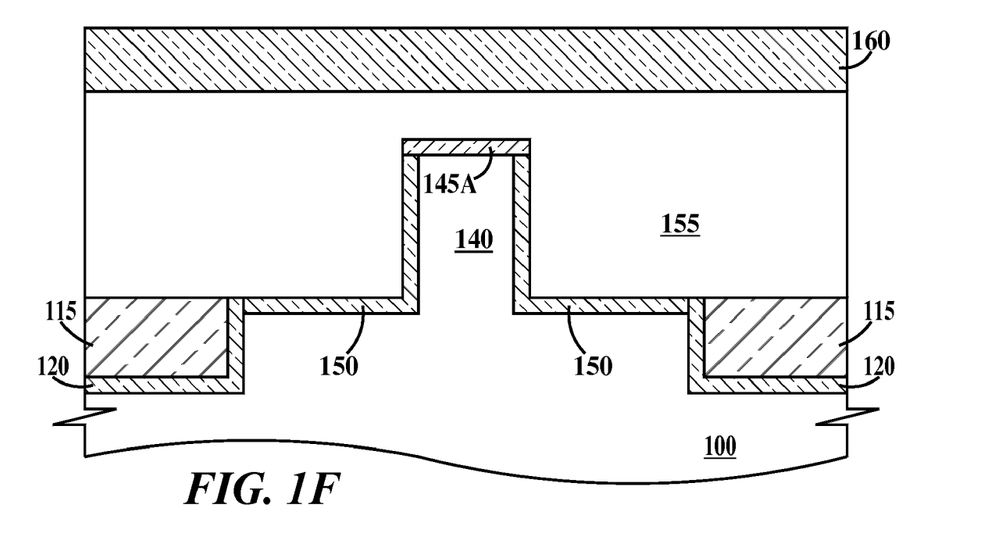

In FIG. 1F, a gate dielectric layer 150 is formed on the sidewalls of fin 140. In the present example, gate dielectric 150 is a thermally grown silicon oxide, so a thin region of exposed substrate 100 is also oxidized. Alternatively, gate dielectric 150 may be deposited. In the example of a deposited gate dielectric, gate dielectric 150 may be a high K (dielectric constant) material, examples of which include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high K dielectric material has a relative permittivity above about 10. In one example, gate dielectric 150 is between about 0.5 nm and about 20 nm thick.

Figure 2:
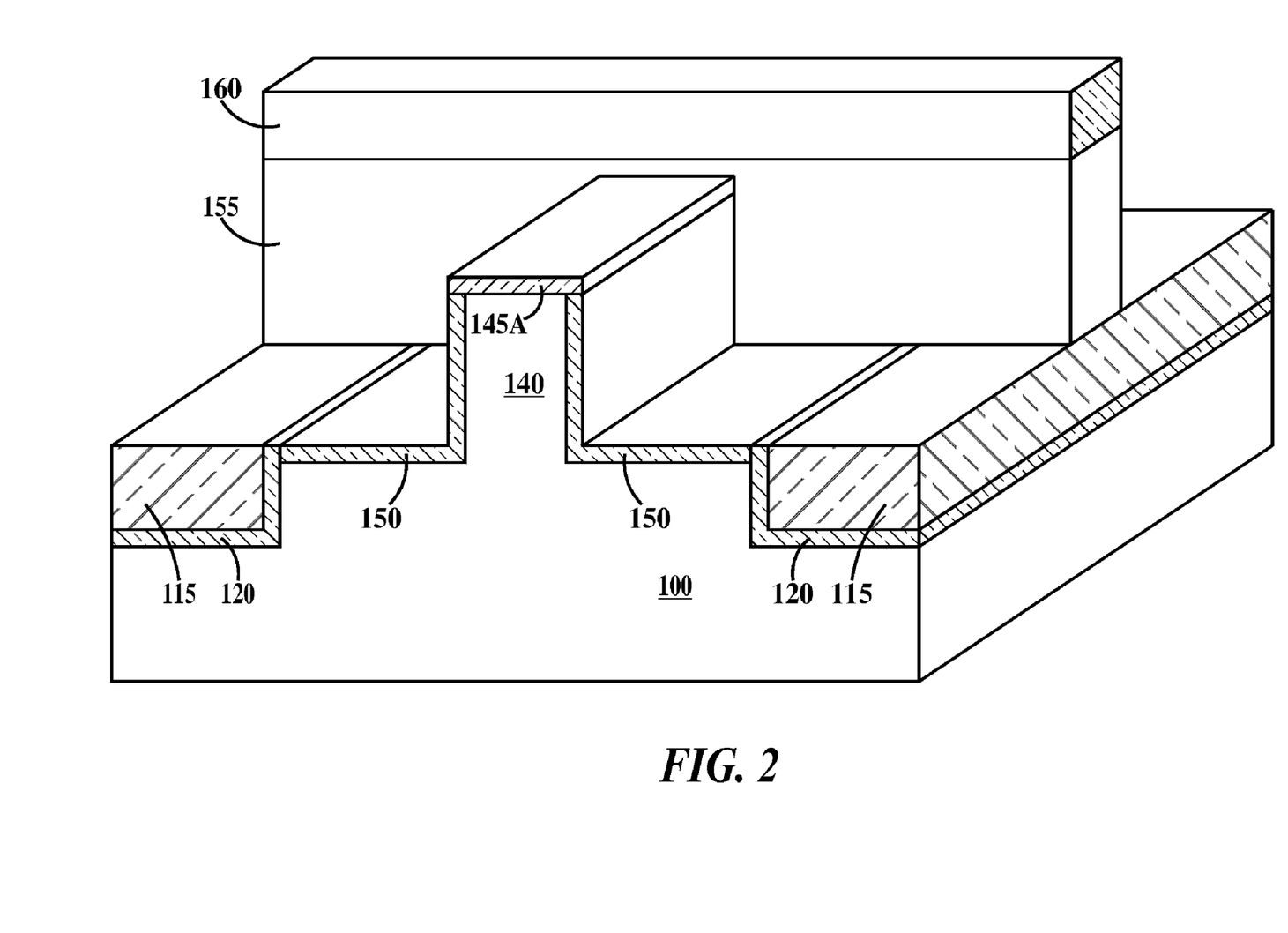
FIG. 2 is a three dimensional isometric view of the structure illustrated in FIG. 1F.

Next a gate 155 is formed crossing over fin 140 and a capping layer 160 formed on the top (but not the sidewalls of the gate (see FIG. 2). In one example, gate 155 comprises doped or undoped polysilicon or a highly silicided metal layer and is at least thick enough to cover the sidewalls of fin 140. In one example, capping layer 160 is silicon nitride and is between about 100 nm and about 500 nm thick.

FIG. 2 is a three dimensional isometric view of the structure illustrated in FIG. 1F. In FIG. 2, gate 155 and capping layer cross fin 140. In one example, fin 140 and gate 155 are orthogonal to each other. In one example, fin 140 and gate 155 may cross at an angle defined by a crystal plane of the fin. In one example, gate 155 and capping layer 160 are formed by blanket CVD deposition of the gate, followed by a CMP, followed by blanket CVD deposition of the capping layer followed by a photolithographic and etch process to define the gate and capping layer.

Figure 3:
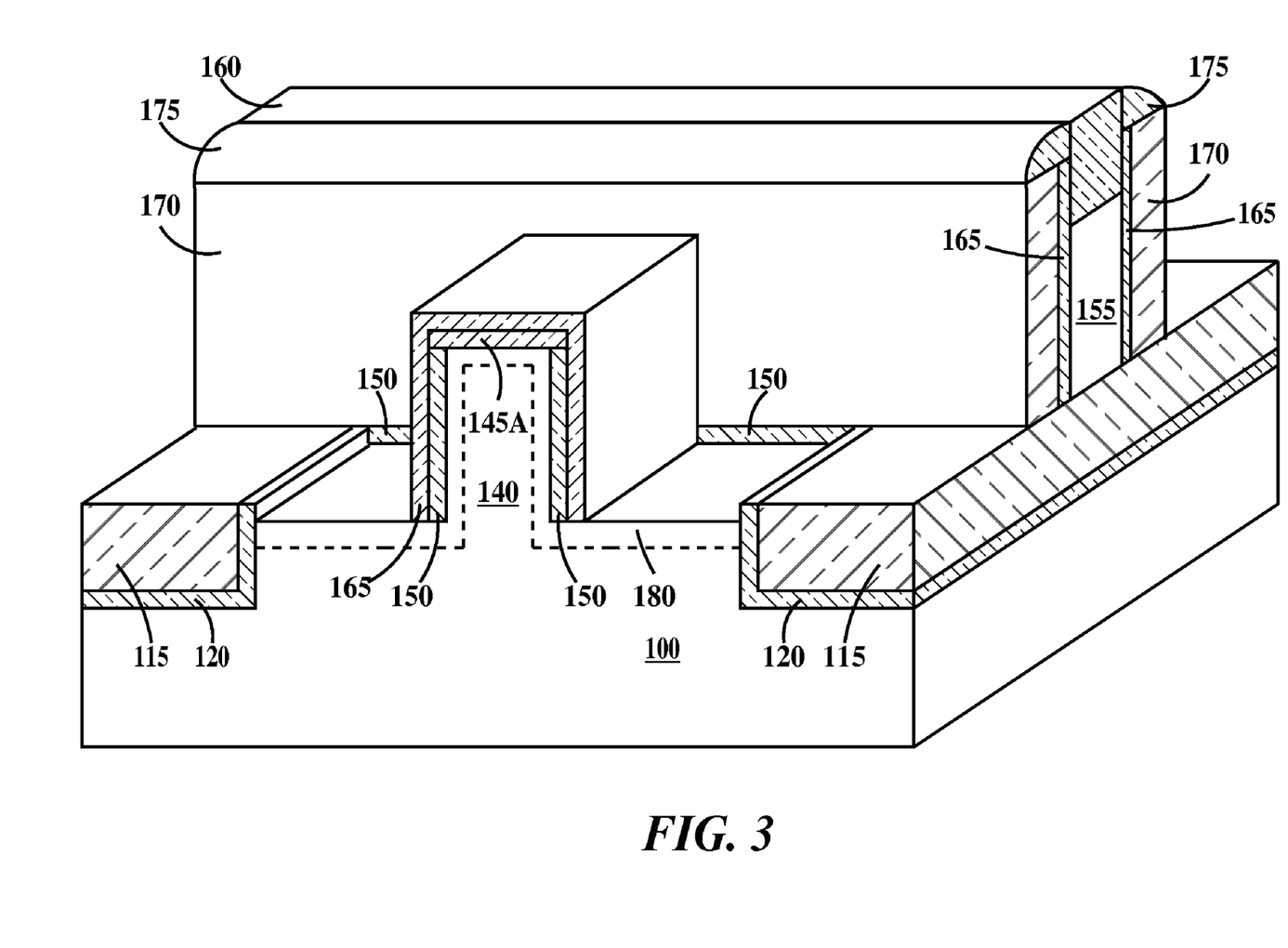
FIG. 3 is a three dimensional isometric view of the structure illustrated in FIG. 2 after additional fabrication steps.

FIG. 3 is a three dimensional isometric view of the structure illustrated in FIG. 2 after additional fabrication steps. In FIG. 3, source/drains 180 are formed by ion implantation and then a first protective layer 165 is formed on the exposed sidewalls of fin 140 and gate 155, a second protective layer 170 formed over first protective layer 165 on the sidewalls of gate 155 and a spacer 175 formed on top edges of first and second protective layers 165 and 170 adjacent to capping layer 160. Formation of first and second protective layers 165 and 170 and spacer 175 may be accomplished, in one example by:

(1) performing a blanket CVD deposition of silicon nitride to form a blanket of layer first protective layer 165;

(2) performing a blanket deposition of a CVD oxide (as described supra) to form a blanket layer of second protective layer 170 over the blanket of layer first protective layer 165;

(3) performing a CMP of the CVD oxide to expose capping layer 160;

(4) performing a RIE recess etch to recess the CVD oxide below the top surface of capping layer 160;

(5) performing a blanket CVD silicon nitride deposition followed by a spacer RIE to form spacers 175; and (6) performing a RIE to remove all CVD oxide not protected by spacers 175.

Figure 4:
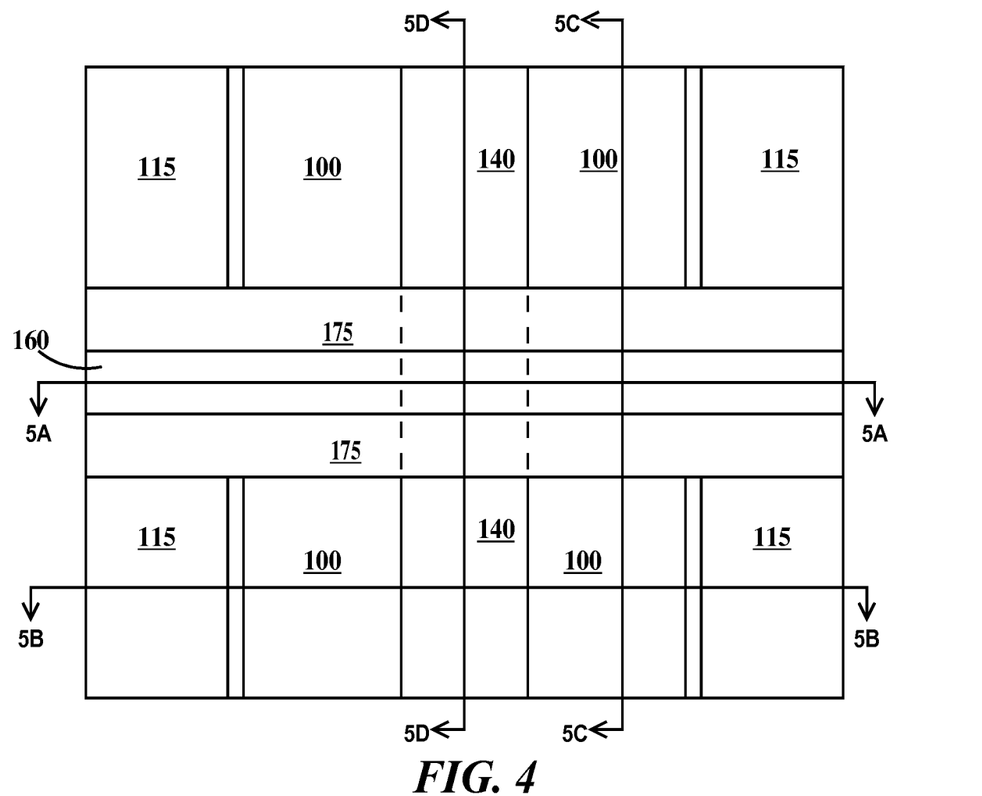
FIG. 4 is a top view.
Figure 5A:
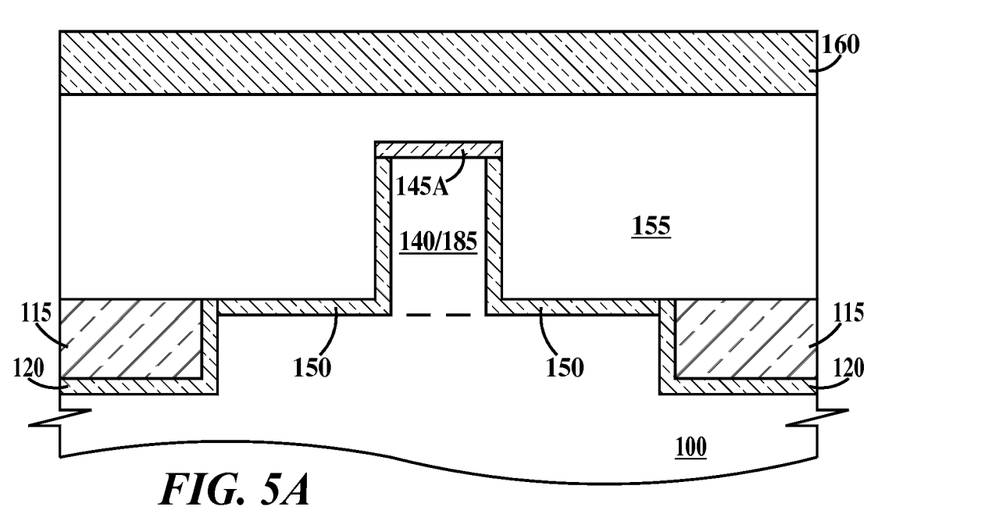
FIGS. 5A, 5B, 5C and 5D are cross-sectional views through respective lines 5A-5A, 5B-5B, 5C-5C and 5D-5D of the structure illustrated in FIG. 3.
Figure 5B:
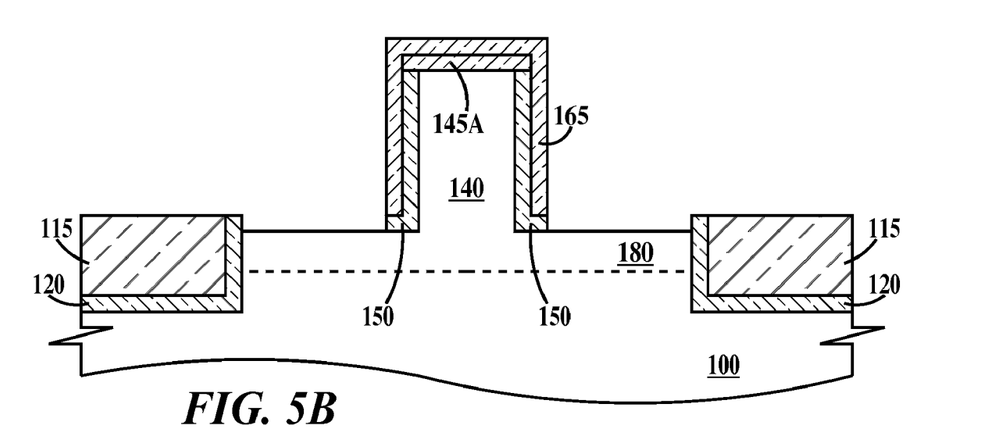
Figure 5C:
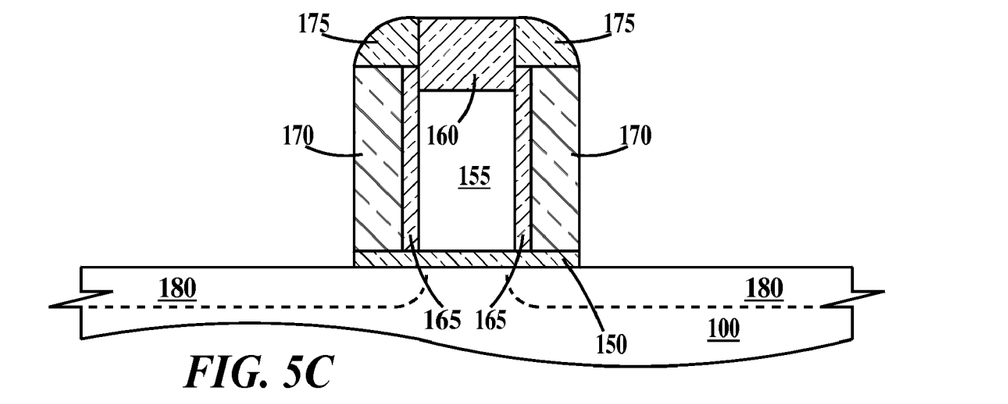
Figure 5D:
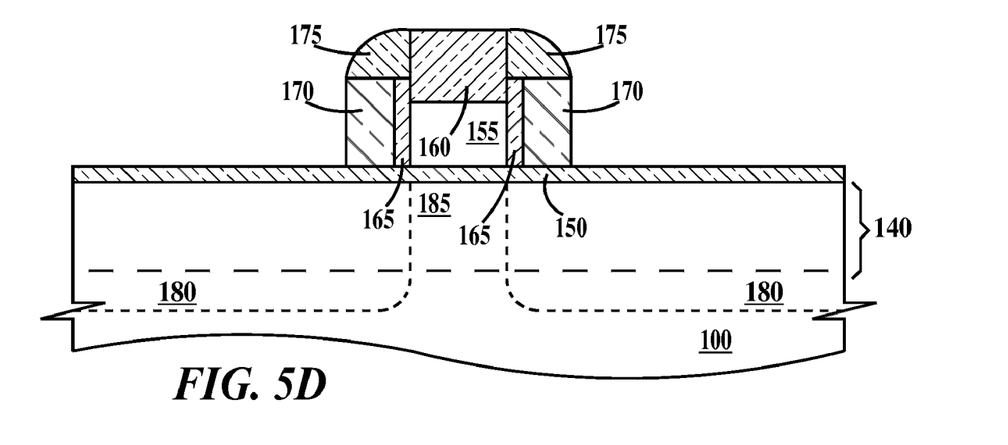

FIG. 4 is a top view and FIGS. 5A, 5B, 5C and 5D are cross-sectional views through respective lines 5A-5A, 5B-5B, 5C-5C and 5D-5D of the structure illustrated in FIG. 3. It should be noted in FIGS. 5B, 5C and 5D that the boundaries of source/drains 180 are indicated by the small-dash dashed lines. In FIGS. 5A and 5D, the interface between substrate 100 and fin 140 is indicated by the large-dash dashed line even though this interface is not detectable since the fin was grown epitaxially. It is shown for reference purposes. Also in FIGS. 5A and 5D, a channel region 185 exists under gate 155 in fin 140.

Figure 6:
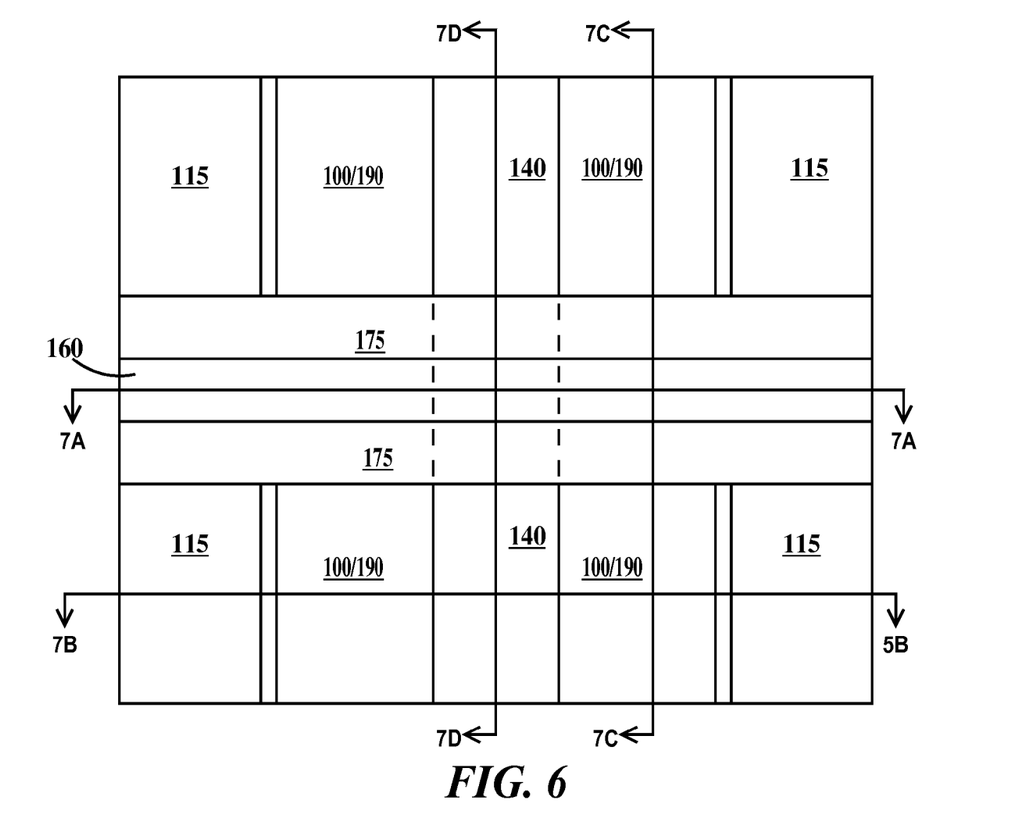
FIG. 6 is a top view.
Figure 7A:
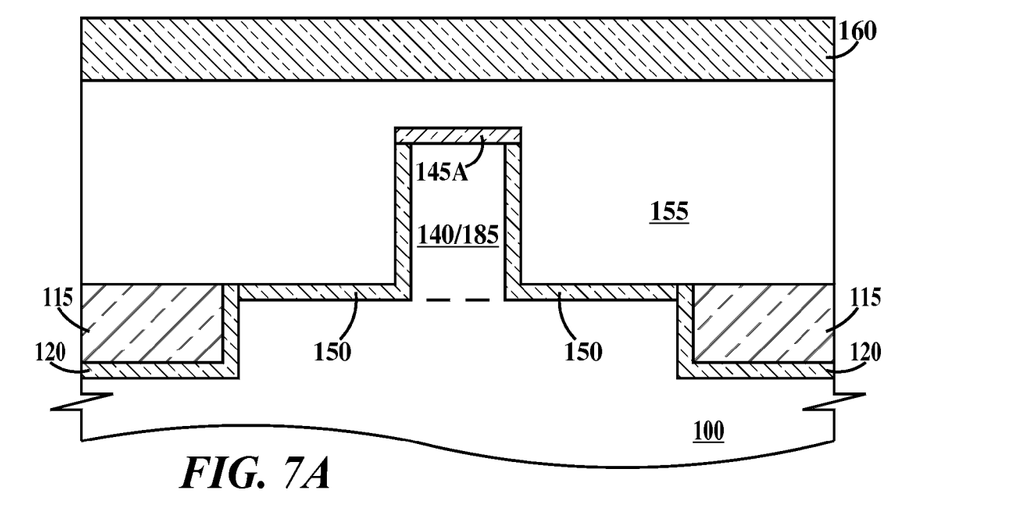
FIGS. 7A, 7B, 7C and 7D are cross-sectional views through respective lines 7A-7A, 7B-7B, 7C-7C and 7D-7D of the structure illustrated in respective FIGS. 4, 5A, 5B, 5C and 5D after additional processing.
Figure 7B:
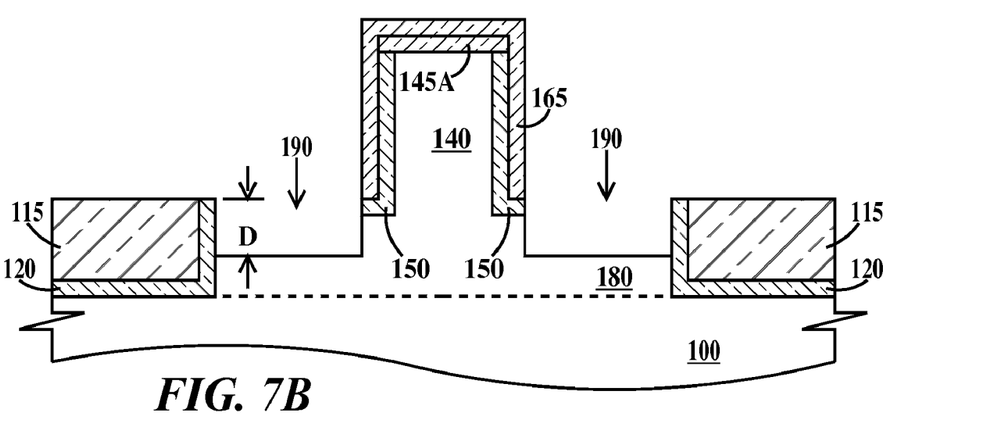
Figure 7C:
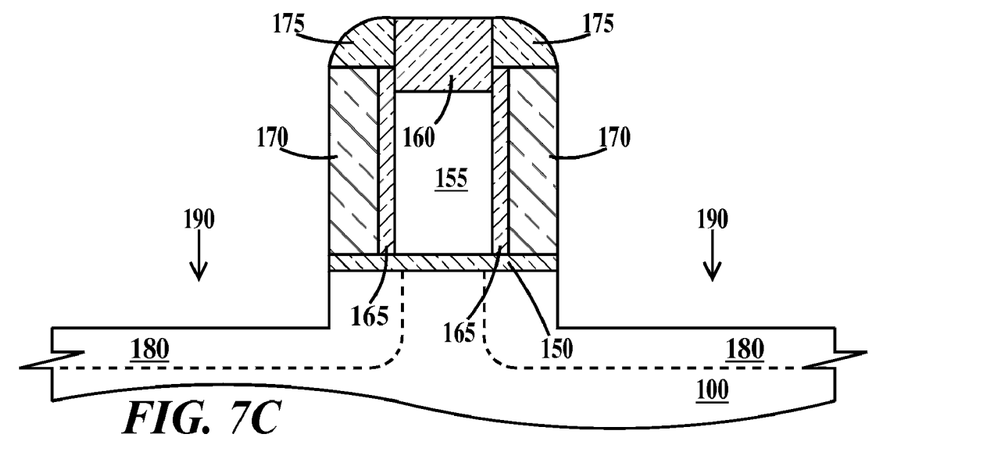
Figure 7D:
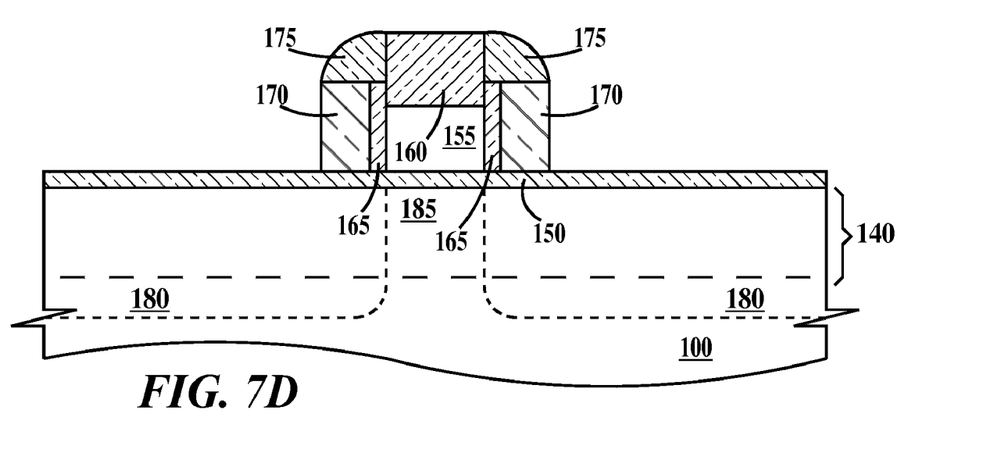

FIG. 6 is a top view and FIGS. 7A, 7B, 7C and 7D are cross-sectional views through respective lines 7A-7A, 7B-7B, 7C-7C and 7D-7D of the structure illustrated in respective FIGS. 4, 5A, 5B, 5C and 5D after additional processing. FIGS. 7A and 7D are identical to respective FIGS. 5A and 5D. In FIGS. 6, 7B and 7C a trench 7C has been etched into substrate 100 a depth "D" using, for example, an RIE selective to etch silicon faster than silicon dioxide and silicon nitride wherever the substrate is exposed (see FIGS. 4, 5B and 5C). In one example "D:" is between about 50 nm and about 250 nm. In one example, "D" is about one half the thickness of STI 115 (or the thickness of STI 115 and liner 120, if liner 1120 is present). Fin 140 is protected from etching by cap 145A, gate dielectric 150 and protective layer 165 while gate 155 is protected from etching by first and second protective layers 165 and 170 as well as cap 160 and spacers 175.

Figure 8:
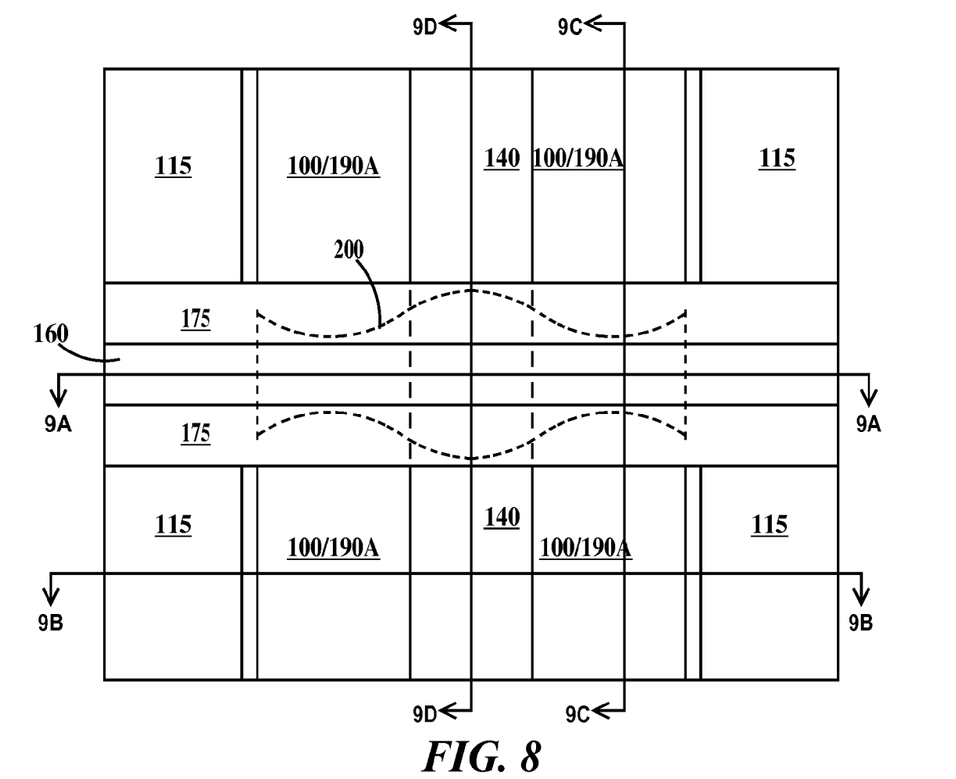
FIG. 8 is a top view.
Figure 9A:
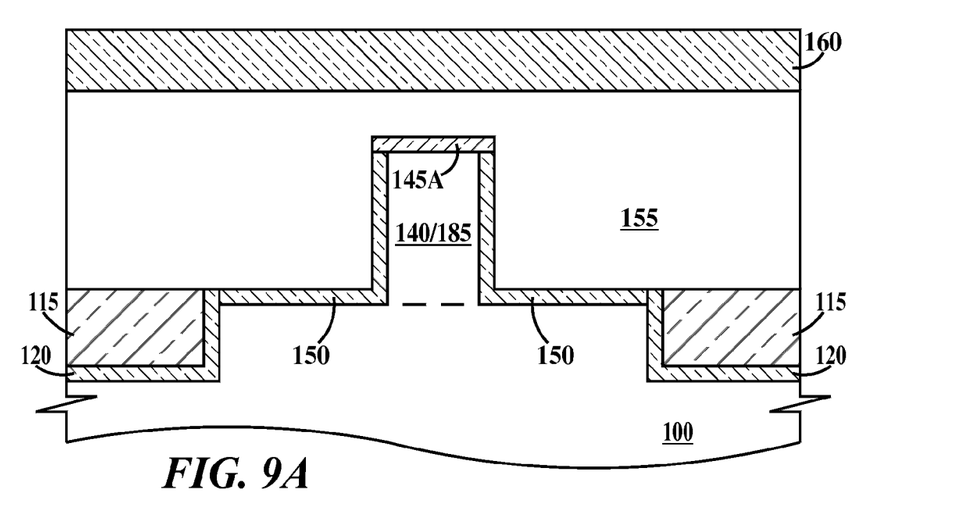
FIGS. 9A, 9B, 9C and 9D are cross-sectional views through respective lines 9A-9A, 9B-9B, 9C-9C and 9D-9D of the structure illustrated in respective FIGS. 6, 7A, 7B, 7C and 7D after additional processing.
Figure 9B:
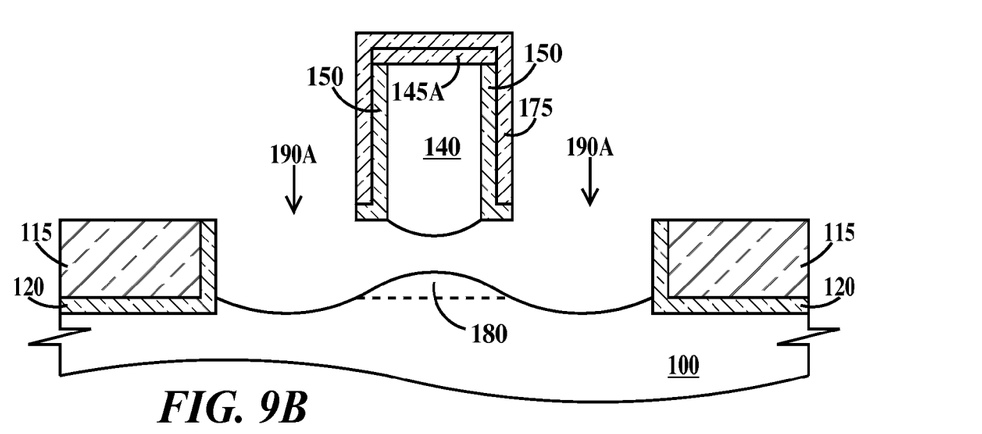
Figure 9C:
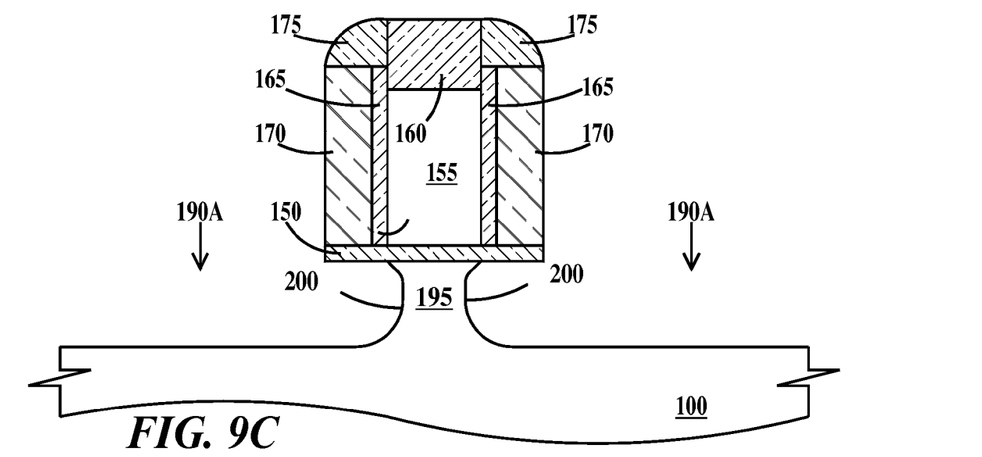
Figure 9D:
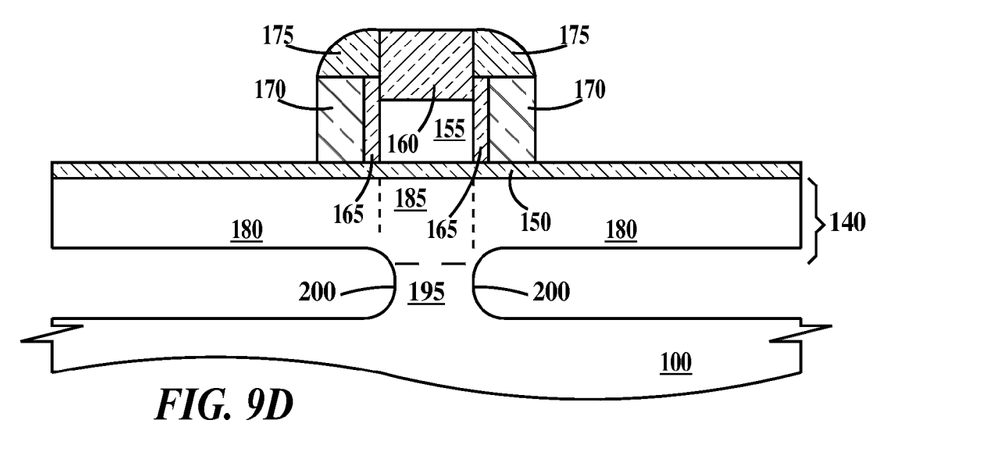

FIG. 8 is a top view and FIGS. 9A, 9B, 9C and 9D are cross-sectional views through respective lines 9A-9A, 9B-9B, 9C-9C and 9D-9D of the structure illustrated in respective FIGS. 6, 7A, 7B, 7C and 7D after additional processing. FIG. 9A is identical with FIG. 7A. In FIGS. 8, 9B, 9C and 9D a wet etch of silicon has been performed to enlarge trench 190 (see, FIGS. 7B and 7C) to form trench 190A and undercut fin 140 in source/drains 180 leaving a pedestal 195 of silicon connecting fin 140 to substrate 100 in channel region 185. Pedestal 195 has an edge 200 indicated by the dashed line in FIG. 8. Depending upon the amount of undercutting, source/drain regions 180 may be completely or partially undercut and the cross-sectional area of pedestal 195 may vary. There may or may not be undercutting of channel region 185. As an example, channel region 185 is partially undercut and the source/drains (not shown in FIG. 9D) are completely undercut and not present in FIG. 9D. A portion of substrate 100 and fin 140 is removed in the undercutting process. The undercutting may be performed isotropically, for example, by wet etching in a mixture of nitric and hydrofluoric acids or by RIE using $CF_4$ or $SF_4$. Alternatively, the undercutting may be performed an-isotropically by wet etching in an aqueous or alcoholic solution of a strong base such as potassium hydroxide or tetrametylammonium hydroxide which etches the [001] crystal plane of silicon faster than the [001] crystal plane. Pedestal 195 provides an electrically conductive body contact between channel region 185 and substrate 100, effectively eliminating floating body effects.

Figure 10:
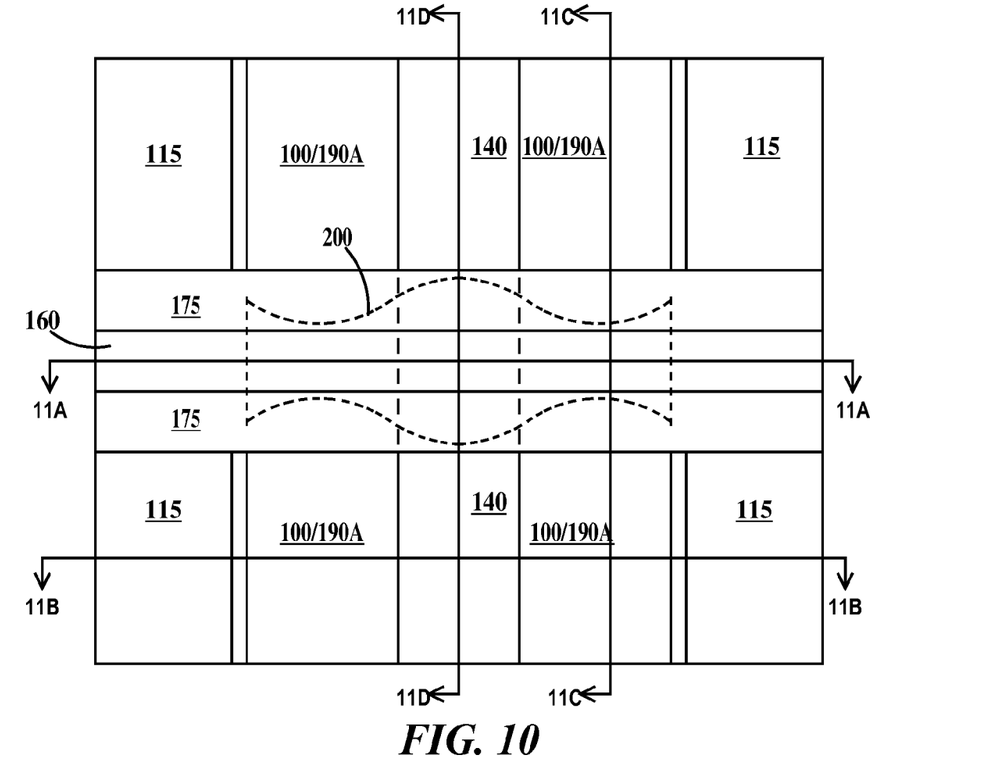
FIG. 10 is a top view and FIGS. 11A, 11B, 11C and 11D are cross-sectional views through respective lines 11A-11A, 11B-11B, 11C-11C and 11D-11D of the structure illustrated in respective FIGS. 8, 9A, 9B, 9C and 9D after additional processing.
Figure 11A:
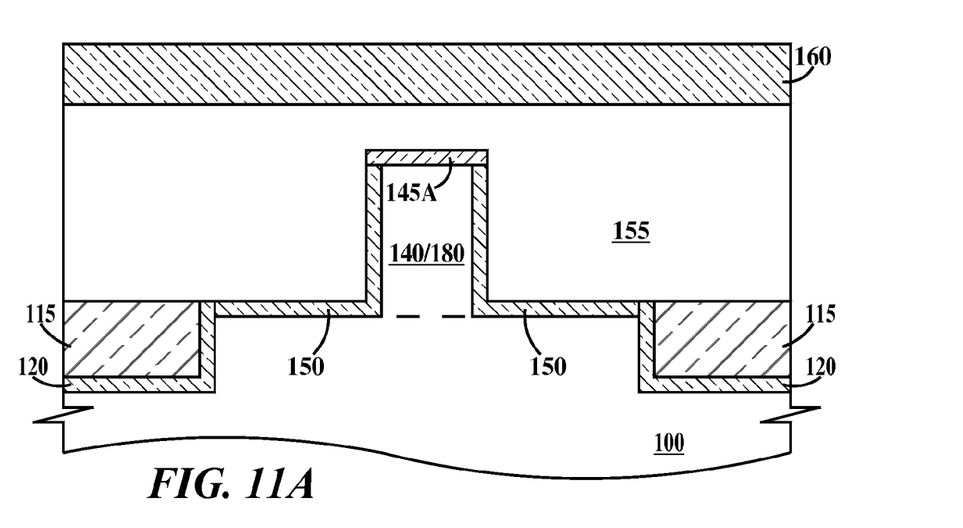
Figure 11B:
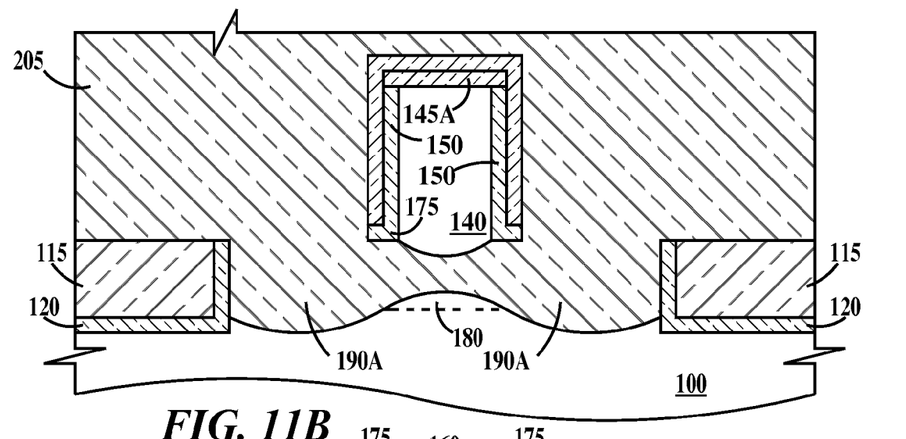
Figure 11C:
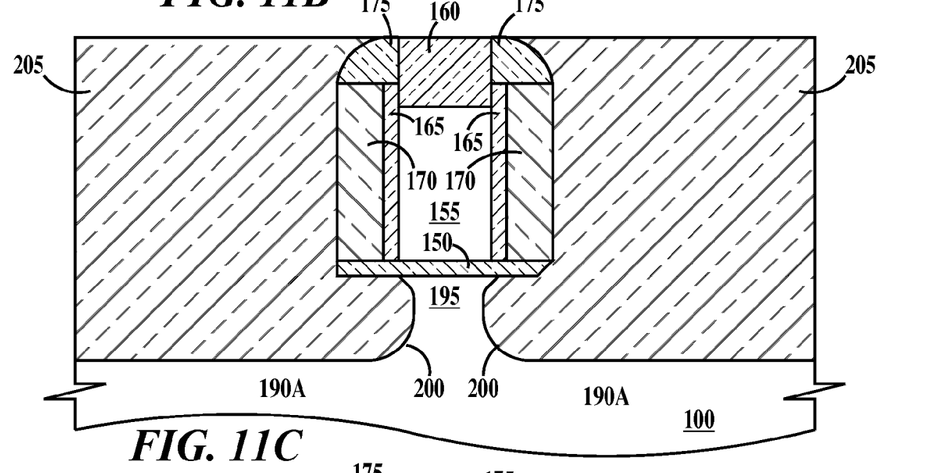
Figure 11D:
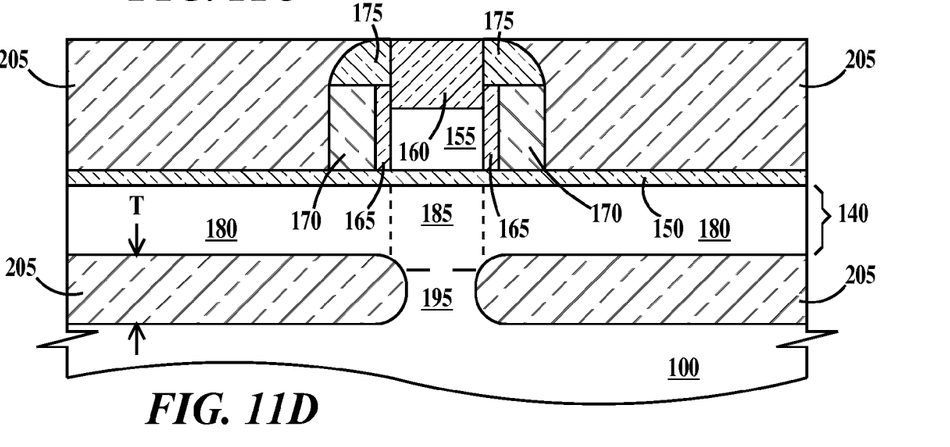

FIG. 10 is a top view and FIGS. 11A, 11B, 11C and 11D are cross-sectional views through respective lines 11A-11A, 11B-11B, 11C-11C and 11D-11D of the structure illustrated in respective FIGS. 8, 9A, 9B, 9C and 9D after additional processing. In FIGS. 10, 11A, 11B, 11C and 11D a dielectric layer 205 is deposited, filling (shown) or partially filling (not shown) the undercut regions of trench 190A. A top surface of dielectric layer 205 is coplanar with a top surface of capping layer 160. In one example, dielectric layer 205 is formed by conformal CVD oxide deposition (such as TEOS or HDP) followed by a CMP. It is permissible not to completely fill undercut regions 190A and leave voids because the remainder of dielectric layer 205 will seal any voids. The distance "T" between fin 140 and substrate 100 under source/drains 180 (see FIG. 11D) whether completely filled or containing voids, greatly reduces parasitic capacitance between the fin and the substrate. In one example, "T" is between about 50 nm and about 250 nm.

Contacts (not shown, but well known in the art) may be formed to the finFET by forming contact via holes through dielectric 205 and capping layers 145A and 160 to source-drains 180 and gate 155, filling the via holes with metal (e.g. barrier liner and tungsten) and performing a CMP. Next, standard processing including formation of levels of wiring and intervening dielectric layers are formed through completion of an integrated circuit chip containing finFET devices according to embodiments of the present invention.

Thus, the embodiments of the present invention provide FinFET devices and a method of fabricating FinFET devices without floating body effects and with reduced parasitic capacitance.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method, comprising:
   forming a mandrel layer on a top surface of a silicon substrate;
   forming an opening in said mandrel layer, a region of said top surface of said substrate exposed in said opening;
   filling said opening with silicon to form a silicon fin on said top surface of said silicon substrate followed by removing said mandrel layer;
   forming a gate dielectric on opposite sidewalls of said fin and said top surface of said substrate on opposite sides of said fin;
   forming a gate electrode over a channel region of said fin, said gate electrode in direct physical contact with said gate dielectric layer on said opposite sidewalls of said fin;
   after said forming said gate electrode, forming a protective dielectric layer on regions of said gate dielectric layer on said opposite sidewalls of said fin not protected by said gate electrode;
   forming a first source/drain in said fin on a first side of said channel region and forming a second source/drain in said fin on a second side of said channel region;
   after forming said first and second source/drains, removing said gate dielectric from said top surface of said silicon substrate where said gate dielectric is not protected by said gate electrode to expose regions of said substrate on opposite sides of said first and second source/drains;
   etching said exposed regions of said substrate to form trenches in said exposed regions of said substrate and to remove a portion of said substrate from under a portion of said fin to create a void communicating with said trenches, a pedestal region of said substrate under said channel region remaining to form a body contact to said fin; and
   filling said void and said trenches with a dielectric material.

2. The method of claim 1, wherein said fin is formed by epitaxial deposition of silicon in said opening.

3. The method of claim 1, wherein said etching said exposed regions of said substrate includes:
   performing a first etch to form said trenches, said trenches not extending under said gate electrode; and
   performing a second isotropic etch to undercut said fin by laterally etching sidewalls of said trenches.

4. The method of claim 3, wherein said second etch removes a layer from said a bottom surface of said fin in a region of said fin exposed to said second etch.

5. The method of claim 1, further including:
   after filling said opening with silicon, performing a chemical-mechanical polish, after said chemical-mechanical-polish a top surface of said fin is coplanar with a top surface of said mandrel layer.

6. The method of claim 1, further including:
   prior to said forming said gate dielectric, forming a capping layer on a top surface of said fin, wherein said protective layer is also formed on said capping layer; and
   forming an additional protective layer on said first protective layer over sidewalls of said gate electrode.

7. The method of claim 1, wherein said substrate comprises single-crystal silicon and said fin comprises polysilicon.

8. The method of claim 1, wherein said substrate comprises single-crystal silicon and said fin comprises single-crystal silicon.

9. The method of claim 1, wherein said void extends under a portion of said channel region.

10. The method of claim 1, wherein after said etching said exposed regions of said substrate, said pedestal contacts said fin only under said channel region of said fin.

11. The method of claim 1, further including:
   before forming said mandrel layer, forming dielectric trench isolation in said substrate and forming said opening in said mandrel in a region of said substrate to said proximate trench isolation.

* * * * *